(12) United States Patent
Sasaki

(10) Patent No.: US 11,948,615 B2
(45) Date of Patent: Apr. 2, 2024

(54) MAGNETIC RECORDING ARRAY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 237 days.

(21) Appl. No.: 17/419,096

(22) PCT Filed: Mar. 5, 2020

(86) PCT No.: PCT/JP2020/009377
§ 371 (c)(1),
(2) Date: Jun. 28, 2021

(87) PCT Pub. No.: WO2021/176644
PCT Pub. Date: Sep. 10, 2021

(65) Prior Publication Data
US 2022/0310145 A1    Sep. 29, 2022

(51) Int. Cl.
*G11C 11/16* (2006.01)
*G11C 11/18* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............................. G11C 11/161; G11C 11/16
(Continued)

(56) References Cited

U.S. PATENT DOCUMENTS 8,350,347 B2    1/2013  Gaudin et al.
9,875,782 B2 *  1/2018  Jo ........................ G11C 11/161
(Continued)

FOREIGN PATENT DOCUMENTS

CN    110268515 A    9/2019
JP    2005-526351 A    9/2005
(Continued)

OTHER PUBLICATIONS

Y. K. Kato et al., "Observation of the Spin Hall Effect in Semiconductors," Science, vol. 306, 1910-1913, (2004).
(Continued)

*Primary Examiner* — Anthan Tran
(74) *Attorney, Agent, or Firm* — Oliff PLC

(57) ABSTRACT

A magnetic recording array includes a plurality of spin elements, and a shared transistor connected to a first spin element and a second spin element adjacent to each other, in which each of the plurality of spin elements includes a wiring and a laminate including a first ferromagnetic layer laminated on the wiring, the shared transistor includes a first gate, a second gate, a first region, a second region, and a third region, in a plan view in a laminating direction of the laminate, the first region is sandwiched between the first gate and the second gate, the second region together with the first region sandwiches the first gate, and the third region together with the first region sandwiches the second gate, and one of the second region and the third region is connected to the first spin element, and the other is connected to the second spin element.

1 Claim, 8 Drawing Sheets

(51) Int. Cl.
- *H10B 61/00* (2023.01)
- *H10N 50/10* (2023.01)
- *H10N 50/85* (2023.01)
- *H10N 52/80* (2023.01)

(52) U.S. Cl.
CPC .............. *G11C 11/18* (2013.01); *H10B 61/22* (2023.02); *H10N 50/10* (2023.02); *H10N 50/85* (2023.02); *H10N 52/80* (2023.02)

(58) Field of Classification Search
USPC ........................................................ 365/158
See application file for complete search history.

(56) References Cited

U.S. PATENT DOCUMENTS

| | | | |
|---|---|---|---|
| 2006/0056223 | A1 | 3/2006 | Ditewig et al. |
| 2009/0014703 | A1* | 1/2009 | Inaba ..................... B82Y 10/00 |
| | | | 257/E47.001 |
| 2011/0129691 | A1 | 6/2011 | Ishiwata et al. |
| 2015/0129995 | A1 | 5/2015 | Wang et al. |
| 2015/0348606 | A1 | 12/2015 | Buhrman et al. |
| 2016/0020207 | A1 | 1/2016 | Tsuchiya et al. |
| 2016/0276008 | A1* | 9/2016 | Saida ....................... G11C 7/12 |
| 2017/0076770 | A1 | 3/2017 | Daibou et al. |
| 2017/0222135 | A1 | 8/2017 | Fukami et al. |
| 2019/0051820 | A1 | 2/2019 | Sugiyama et al. |
| 2019/0189516 | A1 | 6/2019 | Sasaki et al. |
| 2019/0333558 | A1 | 10/2019 | Shibata |
| 2019/0371383 | A1* | 12/2019 | Chiang ................. H10N 50/80 |

FOREIGN PATENT DOCUMENTS

| | | |
|---|---|---|
| JP | 2009-260083 A | 11/2009 |
| JP | 2009-295642 A | 12/2009 |
| JP | 2014-045196 A | 3/2014 |
| JP | 5441005 B2 | 3/2014 |
| JP | 2016-021530 A | 2/2016 |
| JP | 2017-059634 A | 3/2017 |
| JP | 2017-216286 A | 12/2017 |
| JP | 2019-033166 A | 2/2019 |
| JP | 6620915 B1 | 12/2019 |
| WO | 2015/041934 A1 | 3/2015 |
| WO | 2015/200003 A1 | 12/2015 |
| WO | 2016/021468 A1 | 2/2016 |
| WO | 2018/189964 A1 | 10/2018 |
| WO | 2019/171715 A1 | 9/2019 |

OTHER PUBLICATIONS

I. M. Miron et al., "Perpendicular switching of a single ferromagnetic layer induced by in-plane current injection," Nature, vol. 476, 189-194, (2011).

L. Liu et al., "Spin torque switching with the giant spin Hall effect of tantalum," Science, vol. 336, 555, 32 pages, (2012).

L. Liu et al., "Current-Induced Switching of Perpendicularly Magnetized Magnetic Layers Using Spin Torque from the Spin Hall Effect," Physical Review Letters, vol. 109, 096602-1-096602-5, (2012).

K. S. Lee et al., "Threshold current for switching of a perpendicular magnetic layer induced by spin Hall effect," Applied Physics Letters, vol. 102, 112410, 18 pages, (2013).

K. S. Lee et al., "Thermally activated switching of perpendicular magnet by spin-orbit spin torque," Applied Physics Letters, vol. 104, 072413-1 072413-5, (2014).

S. Fukami et al., "Magnetization switching by spin-orbit torque in an antiferromagnet-ferromagnet bilayer system," nature materials, vol. 15, 535-542, (2016).

S. Fukami et al., "A spin-orbit torque switching scheme with collinear magnetic easy axis and current configuration," nature nanotechnology, 6 pages, 2016.

S. Takahashi et al., "Spin injection and detection in magnetic nanostructures," Physical Review B, vol. 67, 052409-1-052409-4, (2003).

Y. Seo et al., "Area-Efficient SOT-MRAM With a Schottky Diode," IEEE Electron Device Letters, vol. 37, No. 8, 982-985, 2016.

W. Zhang et al., "Spin Hall Effects in Metallic Antiferromagnets," Physical Review Letters, vol. 113, 196602-1-196602-6, (2014).

H. Sato et al., "Perpendicular-anisotropy CoFeB—MgO magnetic tunnel junctions with a MgO/CoFeB/Ta/CoFeB/MgO recording structure," Applied Physics Letters, vol. 101, 022414-1-022414-4, (2012).

L. Liu et al., "Magnetic Oscillations Driven by the Spin Hall Effect in 3-Terminal Magnetic Tunnel Junction Devices," Physical Review Letters, vol. 109, 186602-1-186602-5, (2012).

T. Kimura et al., "Electrical Control of the Direction of Spin Accumulation," Physical Review Letters, vol. 99, 166601-1-166601-4, (2007).

G. Yu et al., "Switching of perpendicular magnetization by spin-orbit torques in the absence of external magnetic fields," nature nanotechnology, vol. 9, 548-554, 2014.

Y. Seo et al., "High-Density SOT-MRAM Based on Shared Bitline Structure," IEEE Transactions on Very Large Scale Integration (VLSI) Systems, vol. 26, No. 8, 1600-1603, 2018.

* cited by examiner

MAGNETIC RECORDING ARRAY

TECHNICAL FIELD

The present invention relates to a magnetic recording array.

BACKGROUND ART

Attention is being focused on next-generation non-volatile memories that will replace flash memories or the like whose miniaturization has reached their limit. For example, a magnetoresistive random access memory (MRAM), a resistance random access memory (ReRAM), a phase change random access memory (PCRAM) and the like are known as next-generation non-volatile memories.

An MRAM is a memory element that uses a magnetoresistance effect element. A resistance value of the magnetoresistance effect element changes depending on a difference in relative angle between magnetization directions of two magnetic films. The MRAM records the resistance value of the magnetoresistance effect element as data.

Among spin elements that utilize changes in magnetic resistance, attention is being focused on spin-orbit torque magnetoresistance effect elements that utilize a spin-orbit torque (SOT) (for example, Patent Literature 1) and magnetic domain wall displacement type magnetic recording elements that utilize magnetic domain wall displacement (for example, Patent Literature 2).

CITATION LIST

Patent Literature

[Patent Literature 1]
Japanese Unexamined Patent Application, First Publication No. 2017-216286
[Patent Literature 2]
Japanese Patent No. 5441005

SUMMARY OF INVENTION

Technical Problem

In three-terminal type spin elements, a current path for writing data and a current path for reading data are different from each other. These spin elements require a plurality of transistors in order to control a reading current and a writing current. That is, in order to operate one spin element, it is necessary to secure an area for a plurality of transistors.

The present invention has been made in view of the above problem, and an object of the present invention is to provide a magnetic recording array of which integration can be increased.

Solution to Problem (1) A magnetic recording array according to a first aspect includes a plurality of spin elements, and a shared transistor connected to a first spin element and a second spin element adjacent to each other, in which each of the plurality of spin elements includes a wiring and a laminate including a first ferromagnetic layer laminated on the wiring, the shared transistor includes a first gate, a second gate, a first region, a second region, and a third region, in a plan view in a laminating direction of the laminate, the first region is sandwiched between the first gate and the second gate, the second region together with the first region sandwiches the first gate, and the third region together with the first region sandwiches the second gate, and one of the second region and the third region is connected to the first spin element, and the other is connected to the second spin element.

(2) The magnetic recording array according to the above aspect may have a plurality of the shared transistors and may further include a first wiring connected over the first regions of the plurality of shared transistors.

(3) The magnetic recording array according to the above aspect may further include a first wiring control transistor connected to the first wiring.

(4) The magnetic recording array according to the above aspect may have a plurality of the first wirings, and the adjacent first wirings may be connected via a short-circuit transistor.

(5) The magnetic recording array according to the above aspect may further include a second wiring connected over the laminates of the plurality of spin elements.

(6) The magnetic recording array according to the above aspect may further include a second wiring control transistor connected to the second wiring.

(7) The magnetic recording array according to the above aspect may further include a first gate wiring connected to the first gate and a second gate wiring connected to the second gate.

(8) In the magnetic recording array according to the above aspect, the first gate wiring and the second gate wiring may have different heights.

(9) In the magnetic recording array according to the above aspect, the shared transistor may include a first shared transistor, a second shared transistor, and a third shared transistor, the first spin element may be connected to the second regions of the first shared transistor and the second shared transistor, and the second spin element may be connected to the second shared transistor and the third region of the third shared transistor.

(10) In the magnetic recording array according to the above aspect, at least one of the plurality of spin elements may be a first reference element having a higher electrical resistance of the wiring thereof than other spin elements, and at least one of the plurality of spin elements may be a second reference element having a lower electrical resistance of the wiring than other spin elements.

(11) In the magnetic recording array according to the above aspect, a wiring width of the wiring of the first reference element may be narrower than wiring widths of other spin elements, and a wiring width of the wiring of the second reference element may be wider than wiring widths of other spin elements.

(12) In the magnetic recording array according to the above aspect, the laminate may have the first ferromagnetic layer, a non-magnetic layer, and a second ferromagnetic layer from a side close to the wiring, and the wiring may be any of a metal, an alloy, an intermetallic compound, a metal boride, a metal carbide, a metal silicide, and a metal phosphide that have a function of generating a spin current by the spin Hall effect when an electric current flows.

(13) In the magnetic recording array according to the above aspect, the laminate may include the non-magnetic layer and the first ferromagnetic layer from the side close to the wiring, and the wiring may be a ferromagnetic layer capable of having a magnetic domain wall therein.

Advantageous Effects of Invention

The magnetic recording array according to the above aspect has excellent integration.

DESCRIPTION OF EMBODIMENTS

Figure 1:
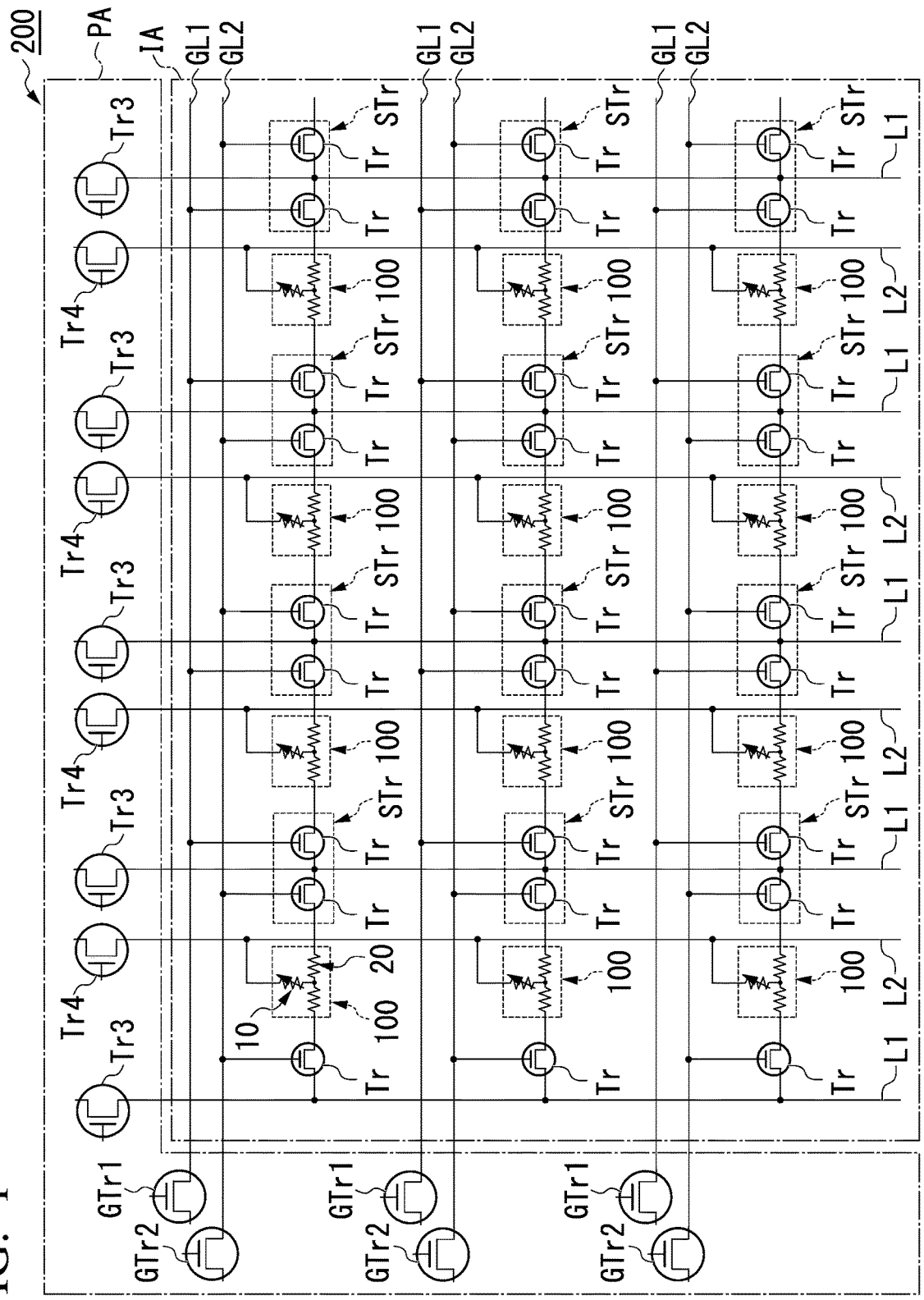
FIG. 1 is a circuit diagram of a magnetic recording array according to a first embodiment.

Hereinafter, the present embodiment will be described in detail with reference to the drawings as appropriate. In the drawings used in the following description, featured portions may be shown in an enlarged manner for convenience in order to make the features easy to understand, and dimensional ratios or the like of respective components may be different from the actual ones. Materials, dimensions, and the like exemplified in the following description are examples, and the present invention is not limited thereto and can be appropriately modified and carried out within the range in which the effects of the present invention are achieved.

First, directions will be defined. One direction along one surface of a substrate Sub (see FIG. 2), which will be described later, is defined as an x direction, and a direction orthogonal to the x direction is defined as a y direction. The x direction is, for example, a direction of a row in which spin elements are arranged in a magnetic recording array, which will be described later. The y direction is, for example, a direction of a column in which the spin elements are arranged in the magnetic recording array, which will be described later. The z direction is a direction orthogonal to the x direction and the y direction. The z direction is an example of a laminating direction. Hereinafter, the +z direction may be expressed as "upward" and the −z direction may be expressed as "downward." The upward and downward directions do not always coincide with the direction in which gravity is applied.

First Embodiment

FIG. 1 is a circuit diagram of a magnetic recording array 200 according to a first embodiment. The magnetic recording array 200 has an integration area IA and a peripheral area PA.

The integration area IA is an area in which a plurality of magnetoresistance effect elements 100 are integrated. The magnetoresistance effect element 100 is an example of a spin element. The integration area IA includes, for example, the plurality of magnetoresistance effect elements 100, a plurality of shared transistors Str, a plurality of first wirings L1, a plurality of second wirings L2, a plurality of first gate wirings GL1, and a plurality of second gate wiring GL2. When integration in the integration area IA increases, a recording density of the magnetic recording array 200 increases.

The magnetoresistance effect elements 100 are arranged in a matrix, for example. The shared transistors STr are, for example, between the magnetoresistance effect elements 100 adjacent to each other in the x direction. The shared transistor Str is a combination of two transistors Tr. The shared transistor STr is connected to, for example, each of two magnetoresistance effect elements 100 adjacent to each other in the x direction. One magnetoresistance effect element 100 connected to the shared transistor STr may be referred to as a first magnetoresistance effect element, and the other magnetoresistance effect element 100 may be referred to as a second magnetoresistance effect element. The first magnetoresistance effect element is an example of a first spin element, and the second magnetoresistance effect element is an example of a second spin element.

The first wirings L1 are connected to, for example, wirings 20, which will be described later, of the magnetoresistance effect elements 100 via the transistors Tr. The first wirings L1 extend in the y direction and are arranged in the x direction, for example. The first wirings L1 are connected to, for example, each of the magnetoresistance effect elements 100 in the same row.

The second wirings L2 are connected to, for example, laminates 10, which will be described later, of the magnetoresistance effect elements 100. Switching elements (for example, transistors) may be provided between the laminates 10 and the second wirings L2. The second wirings L2 extend in the y direction and are arranged in the x direction, for example. The second wirings L2 are connected to, for example, each of the magnetoresistance effect elements 100 in the same row.

The first gate wirings GL1 are connected to first gates G1, which will be described later, of the shared transistors STr. The first gate wirings GL1 extend in the x direction and are arranged in the y direction, for example. The first gate wirings GL1 are connected to, for example, the shared transistors STr in the same row.

The second gate wirings GL2 are connected to second gates G2, which will be described later, of the shared transistors STr. The second gate wirings GL2 extend in the x direction and are arranged in the y direction, for example. The second gate wirings GL2 are connected to, for example, the shared transistors STr in the same row.

The peripheral area PA is an area in which control elements that control operations of the magnetoresistance effect elements 100 in the integration area IA are mounted. The peripheral area PA is, for example, outside the integration area IA. The peripheral area PA includes, for example, a plurality of first wiring control transistors Tr3, a plurality of second wiring control transistors Tr4, a plurality of first gate transistors GTr1, and a plurality of second gate transistors GTr2.

The first wiring control transistors Tr3 are connected to the first wirings L1. The first wiring control transistors Tr3 are connected to, for example, end portions of the first wirings L1. The first wiring control transistors Tr3 control electric currents flowing through the first wirings L1. By controlling the first wiring control transistors Tr3 and the transistors Tr, it is possible to control writing of data to the magnetoresistance effect elements 100.

The second wiring control transistors Tr4 are connected to the second wirings L2. The second wiring control transistors Tr4 are connected to, for example, end portions of the second wirings L2. The second wiring control transistors Tr4 control electric currents flowing through the second wirings L2. By controlling the second wiring control transistors Tr4 and the transistors Tr, it is possible to control reading of data from the magnetoresistance effect elements 100.

The first gate transistors GTr1 are connected to the first gate wirings GL1. The first gate transistors GTr1 are connected to end portions of the first gate wirings GL1. The first gate transistors GTr1 control electric currents flowing through the first gate wirings GL1 and control turning on and off of one of the shared transistors STr.

The second gate transistors GTr2 are connected to the second gate wirings GL2. The second gate transistors GTr2 are connected to end portions of the second gate wirings GL2. The second gate transistors GTr2 control electric currents flowing through the second gate wirings GL2 and control turning on and off of one of the shared transistors STr.

The first wiring control transistors Tr3, the second wiring control transistors Tr4, the first gate transistors GTr1, and the second gate transistors GTr2 are, for example, field effect transistors. The first wiring control transistors Tr3, the second wiring control transistors Tr4, the first gate transistors GTr1, and the second gate transistors GTr2 may be replaced with other switching elements. The switching elements include, for example, an element that utilizes a phase change of a crystal layer such as an ovonic threshold switch (OTS), an element that utilizes a change in band structure such as a metal insulator transition (MIT) switch, an element that utilizes a breakdown voltage such as a Zener diode and an avalanche diode, and an element whose conductivity changes as an atomic position changes.

Figure 2:
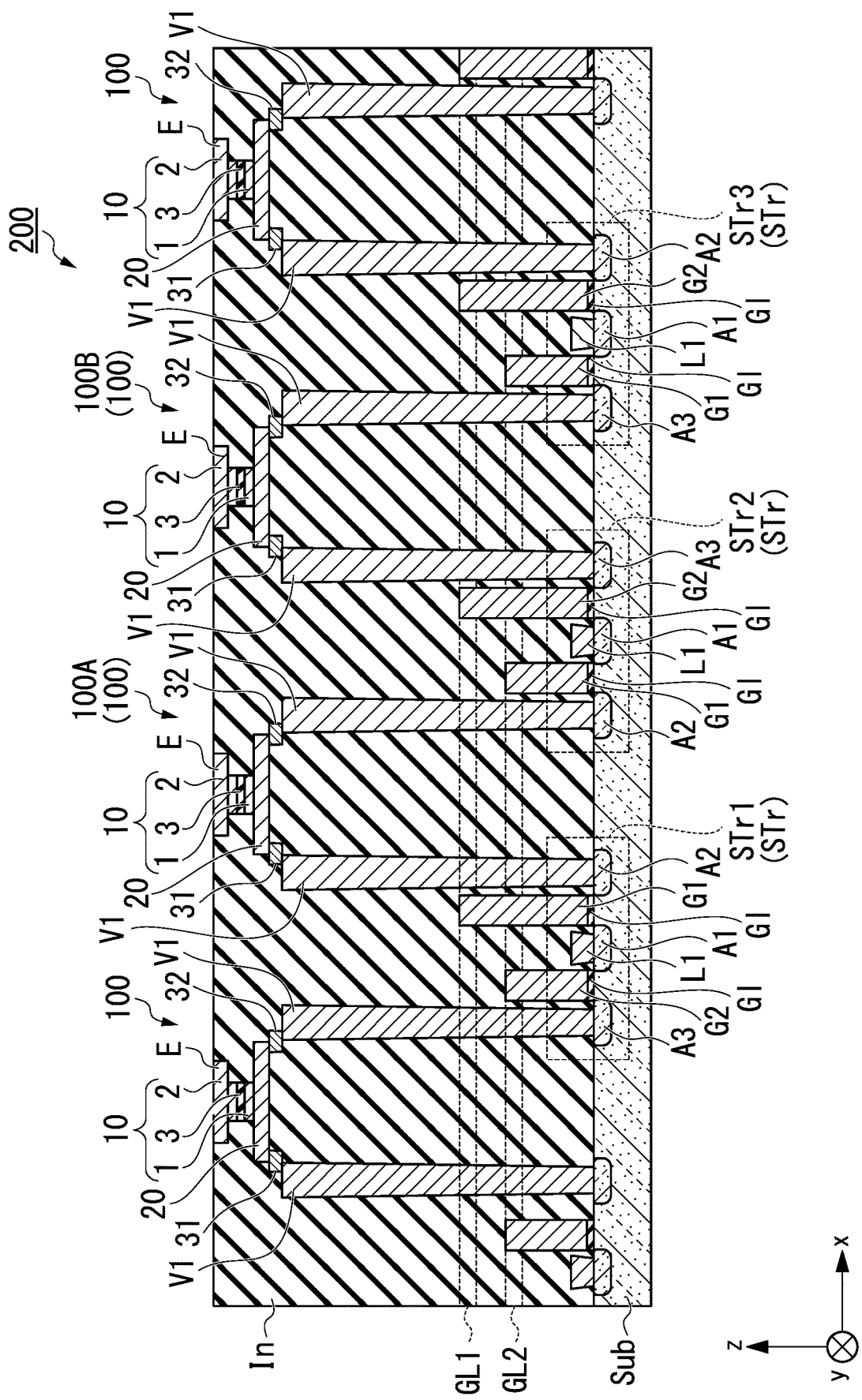
FIG. 2 is a cross-sectional view of the magnetic recording array according to the first embodiment.
Figure 3:
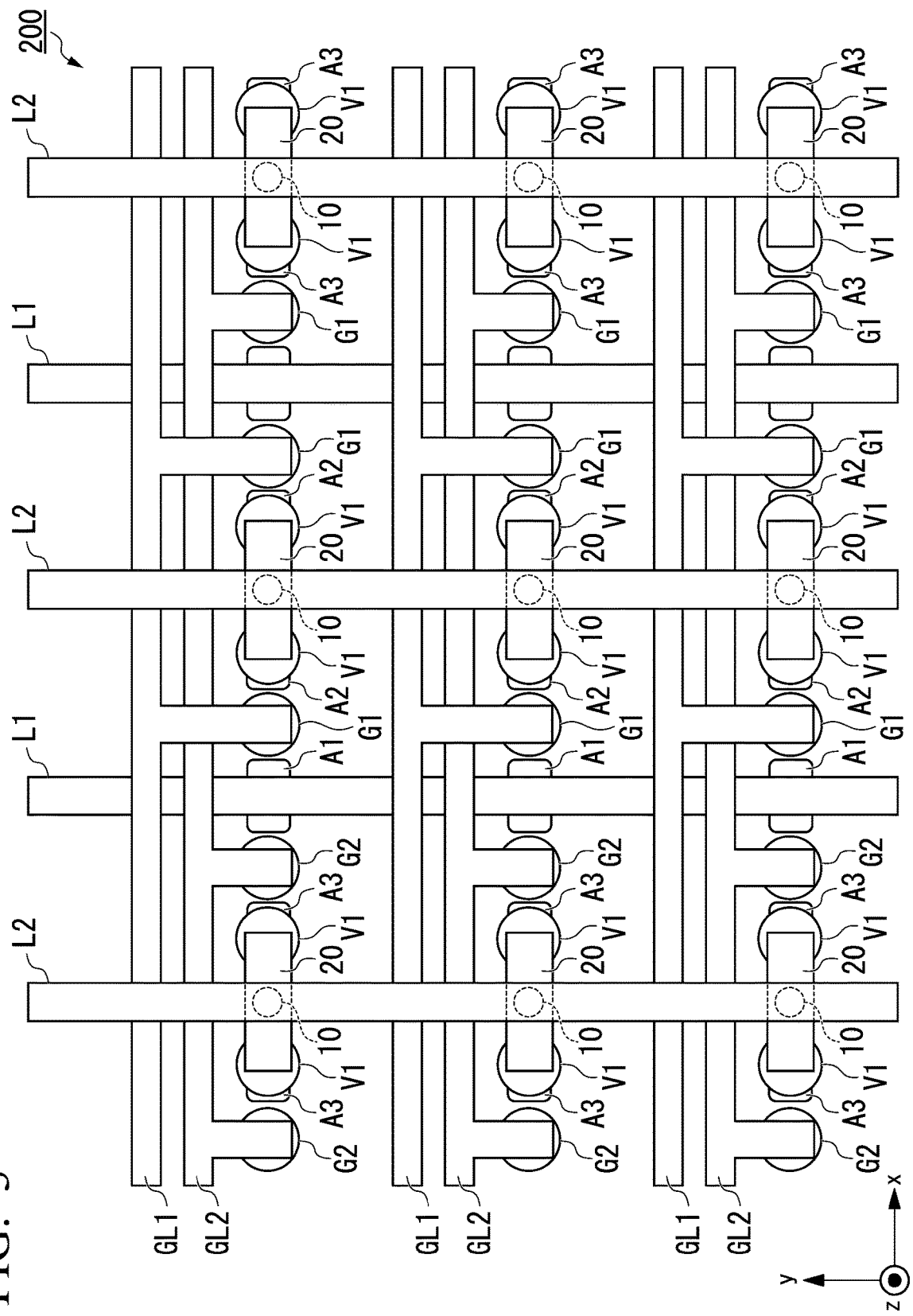
FIG. 3 is a plan view of the magnetic recording array according to the first embodiment.

FIG. 2 is a cross-sectional view of the magnetic recording array 200 according to the first embodiment. FIG. 2 is an x-z cross-section of the magnetoresistance effect elements 100 passing through the center in the y direction. In FIG. 2, for the sake of explanation, the first gate wirings GL1 and the second gate wirings GL2 located at different positions in the y direction are shown by dotted lines. FIG. 3 is a plan view of the magnetic recording array 200 according to the first embodiment from the z direction. In FIG. 3, only the conductive portion is extracted and shown.

The magnetoresistance effect elements 100 and the shared transistors STr are on the substrate Sub. The magnetoresistance effect elements 100 and the shared transistors STr are connected by via wirings V1. The magnetoresistance effect elements 100 and the shared transistors STr are in different layers in different positions in the z direction.

Peripheries of the magnetoresistance effect elements 100, the shared transistors STr, and the via wirings V1 are covered with an insulating layer In. The insulating layer In is an insulating layer that insulates between wirings of a multilayer wiring and between elements. The insulating layer In is made of, for example, silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), zirconium oxide ($ZrO_x$), or the like.

The shared transistors STr are, for example, field effect transistors. The shared transistor STr has a first gate G1, a second gate G2, a gate insulating film G1, a first region A1, a second region A2, and a third region A3.

The first region A1, the second region A2, and the third region A3 are source or drain regions of a transistor. The first region A1, the second region A2, and the third region A3 are formed on the substrate Sub. The substrate Sub is, for example, a semiconductor substrate. The first region A1 is sandwiched between the first gate G1 and the second gate G2 in a plan view from the z direction. The second region A2 together with the first region A1 sandwiches the first gate G1 in a plan view in the z direction. The third region A3 together with the first region A1 sandwiches the second gate G2 in a plan view in the z direction.

The first gate G1 controls a flow of electric charge between the first region A1 and the second region A2. The second gate G2 controls a flow of electric charge between the second region A2 and the third region A3. The first region A1, the second region A2, and the first gate G1 function as one transistor Tr, and the first region A1, the third region A3, and the second gate G2 function as one transistor Tr.

The first region A1 is in contact with, for example, the first wiring L1. The first wiring L1 is connected over, for example, the first regions A1 of the plurality of shared transistors Str adjacent to each other in the y direction.

The second region A2 and the third region A3 are connected to the magnetoresistance effect elements 100 via the via wiring V1. The second region A2 and the third region A3 are connected to different magnetoresistance effect elements 100. For example, the second region A2 is connected to a first magnetoresistance effect element 100A via the via wiring V1, and the third region is connected to a second magnetoresistance effect element 100B via the via wiring V1.

The first gate G1 is connected to the first gate wiring GL1. The second gate G2 is connected to the second gate wiring GL2. The first gate wiring GL1 and the second gate wiring GL2 are, for example, at different heights in the z direction. When the heights of the first gate wiring GL1 and the second gate wiring GL2 in the z direction are different from each other, connection of the wirings can be easier and integration of the integration area IA increases.

In the shared transistors STr adjacent in the x direction, the arrangement order of the components constituting the shared transistors STr is reversed. For example, among the shared transistors STR, three shared transistors arranged in the x direction are referred to as a first shared transistor STr1, a second shared transistor STr2, and a third shared transistor STr3. The first shared transistor STr1 is arranged in the x direction in the order of the third region A3, the second gate G2, the first region A1, the first gate G1, and the second region A2, whereas the second shared transistor STr2 is arranged in the x direction in the order of the second region A2, the first gate G1, the first region A1, the second gate G2, and the third region A3.

The first shared transistor STr1 and the second shared transistor STr2 are connected to, for example, the first magnetoresistance effect element 100A. The second shared transistor STr2 and the third shared transistor STr3 are connected to, for example, the second magnetoresistance effect element 100B.

The first magnetoresistance effect element 100A is connected to the second regions A2 of the first shared transistor STr1 and the second shared transistor STr2. That is, writing of data to the first magnetoresistance effect elements 100A is controlled by the first gates G1 of the first shared transistor STr1 and the second shared transistor STr2.

The second magnetoresistance effect element 100B is connected to the third regions A3 of the third shared transistor STr3 and the second shared transistor STr2. That is, writing of data to the second magnetoresistance effect element 100B is controlled by the second gates G2 of the second shared transistor STr2 and the third shared transistor STr3.

In the magnetoresistance effect element 100, an element whose writing is controlled by the first gate G1 (for example, the first magnetoresistance effect element 100A) and an element whose writing is controlled by the second gate G2 (for example, the second magnetoresistance effect element 100B) are arranged alternately in the x direction.

Figure 4:
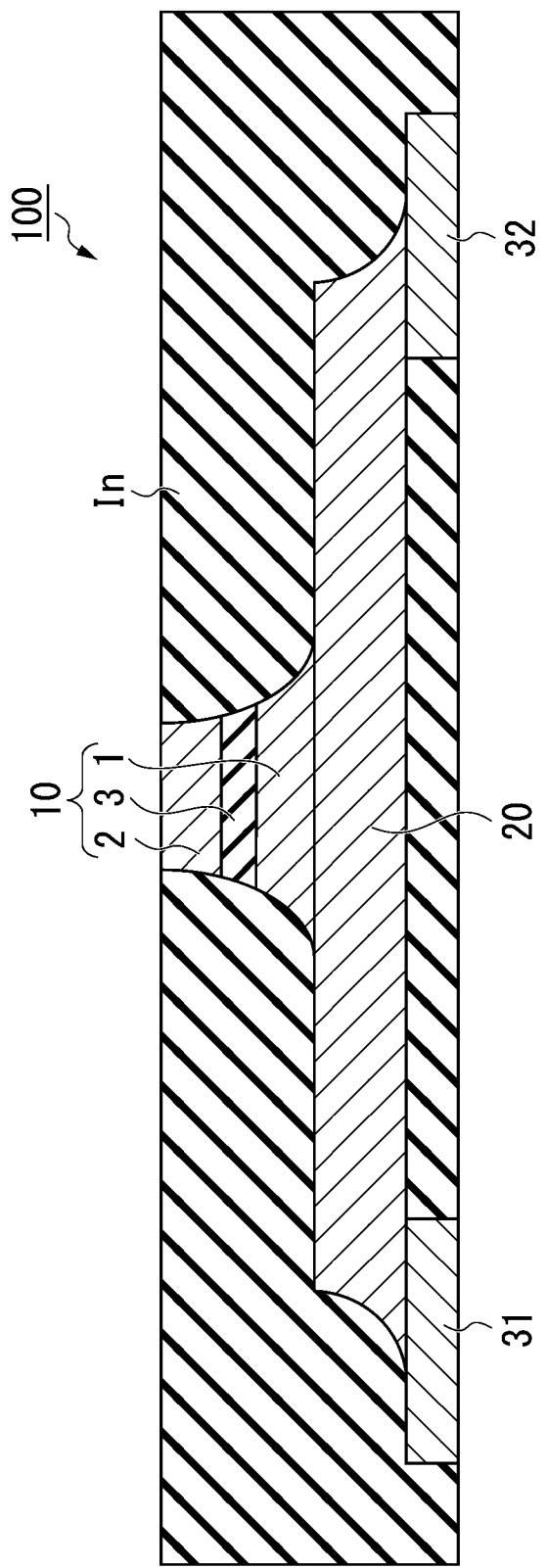
FIG. 4 is a cross-sectional view of a spin element according to the first embodiment.

FIG. 4 is a cross-sectional view of the magnetoresistance effect element 100 according to the first embodiment. FIG. 4 is a cross-section of the magnetoresistance effect element 100 cut in an x-z plane passing through a center of a width of a wiring 20 in the y direction.

The magnetoresistance effect element 100 includes, for example, a laminate 10, the wiring 20, and conductive portions 31 and 32. A resistance value of the laminate 10 in the z direction changes when spins are injected from the wiring 20 into the laminate 10. The magnetoresistance effect element 100 is a spin element using a spin-orbit torque (SOT) and may be referred to as a spin-orbit torque type magnetoresistance effect element, a spin injection type magnetoresistance effect element, or a spin current magnetoresistance effect element. Further, the wiring 20 may be referred to as a spin-orbit torque wiring.

The laminate 10 is laminated on the wiring 20. Another layer may be provided between the laminate 10 and the wiring 20. The laminate 10 is sandwiched between the wiring 20 and an electrode E in the z direction. The laminate 10 is a columnar body. A shape of the laminate 10 in the plan view from the z direction is, for example, a circle, an ellipse, or a quadrangle.

The laminate 10 has a first ferromagnetic layer 1, a second ferromagnetic layer 2, and a non-magnetic layer 3. The first ferromagnetic layer 1 is in contact with the wiring 20 and is laminated on the wiring 20, for example. Spins are injected into the first ferromagnetic layer 1 from the wiring 20. Magnetization of the first ferromagnetic layer 1 receives a spin-orbit torque (SOT) due to the injected spins and an orientation direction thereof changes. The second ferromagnetic layer 2 is in the z direction of the first ferromagnetic layer 1. The first ferromagnetic layer 1 and the second ferromagnetic layer 2 sandwich the non-magnetic layer 3 in the z direction.

The first ferromagnetic layer 1 and the second ferromagnetic layer 2 each have magnetization. The magnetization of the second ferromagnetic layer 2 is less likely to change in the orientation direction than the magnetization of the first ferromagnetic layer 1 when a predetermined external force is applied. The first ferromagnetic layer 1 may be called a magnetization free layer, and the second ferromagnetic layer 2 may be called a magnetization fixed layer or a magnetization reference layer. The resistance value of the laminate 10 changes in accordance with a difference in relative angle of magnetization between the first ferromagnetic layer 1 and the second ferromagnetic layer 2 sandwiching the non-magnetic layer 3.

The first ferromagnetic layer 1 and the second ferromagnetic layer 2 include a ferromagnetic material. The ferromagnetic material is, for example, a metal selected from the group consisting of Cr, Mn, Co, Fe and Ni, an alloy containing at least one of these metals, an alloy containing these metals and at least one or more elements of B, C, and N, or the like. The ferromagnetic material is, for example, Co—Fe, Co—Fe—B, Ni—Fe, Co—Ho alloy, Sm—Fe alloy, Fe—Pt alloy, Co—Pt alloy, or CoCrPt alloy.

The first ferromagnetic layer 1 and the second ferromagnetic layer 2 may contain a Whistler alloy. The Whistler alloy includes an intermetallic compound having a chemical composition of XYZ or $X_2YZ$. X is a transition metal element or noble metal element of Group Co, Fe, Ni, or Cu on the periodic table, Y is a transition metal of Group Mn, V, Cr or Ti, or an elemental species of X, and Z is a typical element of Group III to Group V. The Whistler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Whistler alloy has a high spin polarization.

The laminate 10 may have an antiferromagnetic layer on a surface of the second ferromagnetic layer 2 opposite to the non-magnetic layer 3 via a spacer layer. The second ferromagnetic layer 2, the spacer layer, and the antiferromagnetic layer have a synthetic antiferromagnetic structure (SAF structure). The synthetic antiferromagnetic structure consists of two magnetic layers sandwiching a non-magnetic layer. The antiferromagnetic coupling between the second ferromagnetic layer 2 and the antiferromagnetic layer increases a coercive force of the second ferromagnetic layer 2 as compared with the case without the antiferromagnetic layer. The antiferromagnetic layer is, for example, IrMn, PtMn, or the like. The spacer layer contains, for example, at least one selected from the group consisting of Ru, Ir, and Rh.

The laminate 10 may have a layer other than the first ferromagnetic layer 1, the second ferromagnetic layer 2, and the non-magnetic layer 3. For example, a base layer may be provided between the wiring 20 and the laminate 10. The base layer enhances the crystallinity of each layer constituting the laminate 10.

The wiring 20 is in contact with one surface of the laminate 10, for example. The wiring 20 is a writing wiring for writing data to the magnetoresistance effect element 100. The wiring 20 extends in the x direction. At least a part of the wiring 20 sandwiches the first ferromagnetic layer 1 together with the non-magnetic layer 3 in the z direction.

The wiring 20 generates a spin current due to the spin Hall effect when the current I flows and injects spins into the first ferromagnetic layer 1. The wiring 20 gives, for example, a spin-orbit torque (SOT), which is sufficient to reverse the magnetization of the first ferromagnetic layer 1, to the magnetization of the first ferromagnetic layer 1. The spin Hall effect is a phenomenon in which a spin current is induced in a direction orthogonal to the direction in which a current flows, on the basis of a spin-orbit interaction in a case in which a current is flown. The spin Hall effect is common to a normal Hall effect in that moving (flowing) charges (electrons) can bend the moving (flowing) direction. In a normal Hall effect, a moving direction of charged particles moving in a magnetic field is bent by the Lorentz force. On the other hand, in the spin Hall effect, even in the absence of a magnetic field, a moving direction of a spin is bent only by the movement of electrons (only the flow of a current).

For example, when a current flows through the wiring 20, a first spin oriented in one direction and a second spin oriented in the direction opposite to the first spin are respectively bent due to the spin Hall effect in the direction orthogonal to the direction in which the current I flows. For example, the first spin oriented in the −y direction is bent in the +z direction, and the second spin oriented in the +y direction is bent in the −z direction.

In a non-magnetic material (a material that is not a ferromagnetic material), the number of electrons in the first spin and the number of electrons in the second spin generated due to the spin Hall effect are equal. That is, the number of electrons in the first spin in the +z direction is equal to the number of electrons in the second spin in the −z direction. The first spin and the second spin flow in the direction in which the uneven distribution of spins is eliminated. In the movement of the first spin and the second spin in the z direction, flows of charges cancel each other out, and thus an amount of current becomes zero. A spin current without an electric current is particularly called a pure spin current.

When a flow of electrons of the first spin is indicated by J↑, a flow of electrons of the second spin is indicated by J↓, and a spin current is indicated by $J_S$, it is defined as $J_S$=J↑−J↓. The spin current $J_S$ is generated in the z direction. The first spin is injected from the wiring 20 into the first ferromagnetic layer 1.

The wiring 20 includes any one of a metal, an alloy, an intermetal compound, a metal boride, a metal carbide, a metal silicide, and a metal phosphide, which have a function of generating a spin current due to the spin Hall effect when the current I flows.

The wiring 20 contains, for example, a non-magnetic heavy metal as a main element. The main element is an element having the highest proportion among the elements constituting the wiring 20. The wiring 20 includes, for example, a heavy metal having a specific gravity of yttrium (Y) or more. Since a non-magnetic heavy metal has a large atomic number of 39 or more and has d-electrons or f-electrons in the outermost shell, spin-orbit interaction occurs strongly. The spin Hall effect is generated due to the spin-orbit interaction, spins are likely to be unevenly distributed in the wiring 20, and the spin current JS is likely to occur. The wiring 20 includes, for example, any one selected from the group consisting of Au, Hf, Mo, Pt, W, and Ta.

The wiring 20 may contain a magnetic metal. The magnetic metal is a ferromagnetic metal or an antiferromagnetic metal. A small amount of a magnetic metal contained in a non-magnetic material becomes a spin scattering factor. The small amount is, for example, equal to and less than 3% of a total molar ratio of the elements constituting the wiring 20. When the spins are scattered by the magnetic metal, the spin-orbit interaction is enhanced, and the generation efficiency of the spin current with respect to the current is increased.

The wiring 20 may include a topological insulator. The topological insulator is a substance of which the inside is an insulator or a high resistor, but is a substance having a spin-polarized metallic state on its surface. In the topological insulator, an internal magnetic field is generated due to the spin-orbit interaction. The topological insulator develops a new topological phase due to the spin-orbit interaction effect even in the absence of an external magnetic field. The topological insulator can generate a pure spin current with high efficiency due to strong spin-orbit interaction and breaking of inversion symmetry at an edge thereof.

The topological insulator includes, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. The topological insulator can generate a spin current with high efficiency.

The conductive portion 31 and the conductive portion 32 sandwich the laminate 10 in the x direction in the plan view from the z direction. The conductive portions 31 and 32 are connected to, for example, the via wiring V1. The conductive portions 31 and 32 are made of a material having excellent conductivity. The conductive portions 31 and 32 include, for example, any one selected from the group consisting of Ag, Cu, Co, Al, and Au.

Next, a method for manufacturing the integration area IA of the magnetic recording array 200 will be described. The integration area IA is formed through a laminating step of each layer and a processing step of processing a part of each layer into a predetermined shape. For the lamination of each layer, a sputtering method, a chemical vapor deposition (CVD) method, an electron beam vapor deposition method (EB vapor deposition method), an atomic laser deposit method, or the like can be used. The processing of each layer can be performed using photolithography or the like.

First, impurities are doped at predetermined positions on the substrate Sub to form the first region A1, the second region A2, and the third region A3.

Next, an insulating layer having a certain thickness is formed on the substrate Sub. For example, an opening is formed in the insulating layer by anisotropic etching. The opening is formed at a position between the first region A1 and the third region A3 in the plan view from the z direction. The opening does not penetrate to the substrate Sub, leaving an insulating film at a bottom portion thereof. The insulating film remaining on the bottom portion becomes the gate insulating film GI. The opening is filled with a conductor to become the second gate G2.

Next, a conductive layer is laminated on the insulating layer, and the conductive layer is processed to form the second gate wiring GL2. The second gate wiring GL2 connects the second gates G2 arranged in the x direction.

Next, an insulating layer covering the second gate wiring GL2 is laminated. For example, an opening is formed in the insulating layer by anisotropic etching. The opening is formed at a position between the first region A1 and the second region A2 in the plan view from the z direction. The opening does not penetrate to the substrate Sub, leaving an insulating film at a bottom thereof. The insulating film remaining on the bottom portion becomes the gate insulating film GI. The opening is filled with a conductor to become the first gate G1.

Next, a conductive layer is laminated on the insulating layer, and the conductive layer is processed to form the first gate wiring GL1. The first gate wiring GL1 connects the first gates G1 arranged in the x direction.

Next, an insulating layer covering the second gate wiring GL2 is laminated. For example, openings are formed in the insulating layer by anisotropic etching. The openings are formed at positions overlapping the second region A2 and the third region A3 in the plan view from the z direction. The openings extend to the surface of the substrate Sub. The openings are filled with a conductor and become via wiring V1.

Next, after an insulating layer covering the via wiring V1 is laminated, the conductive portions 31 and 32 are formed at positions overlapping the via wiring V1. For the conductive portions 31 and 32, for example, a material harder than the via wiring V1 is used. Surfaces of the insulating layer and the conductive portions 31 and 32 are chemically mechanically polished (CMP). By using a hard material for the conductive portions 31 and 32, the flatness of the surface is enhanced.

Next, the wiring layer, the ferromagnetic layer, the non-magnetic layer, and the ferromagnetic layer are laminated in order on the surfaces of the insulating layer and the conductive portions 31 and 32. Next, the wiring layer is processed into a predetermined shape. The wiring layer becomes the wiring 20 by being processed into a predetermined shape. Next, the magnetoresistance effect element 100 is obtained by processing the laminate formed on the wiring layer into a predetermined shape to form the laminate 10. Through the above procedure, the integration area IA of the magnetic recording array 200 can be manufactured.

Next, an operation of the magnetic recording array 200 according to the first embodiment will be described. The operation of the magnetic recording array 200 includes a writing operation to and a reading operation from the magnetoresistance effect element 100.

First, the writing operation to an arbitrary magnetoresistance effect element 100 will be described. A case in which data is written to the first magnetoresistance effect element 100A as the arbitrary magnetoresistance effect element 100 will be described as an example.

First, the first gate transistor GTr1 connected to the first magnetoresistance effect element 100A is turned on. When the first gate transistor GTr1 is turned on, the first gate G1 connected to the first gate wiring GL1 opens. Then, the first region A1 and the second region A2 of the shared transistor STr are electrically connected to each other.

Next, the first wiring control transistor Tr3 connected to the first wiring L1 connected to the first shared transistor STr1 and the second shared transistor STr2 is turned on. Since two first wirings L1 adjacent to each other with the first magnetoresistance effect element 100A interposed therebetween are electrically connected to each other, a writing current flows through the wiring 20. On the other hand, since the second gate G2 does not open, a writing current does not flow to the second magnetoresistance effect element 100B.

When a writing current flows through the wiring 20, the spin Hall effect is generated, and spins are injected into the first ferromagnetic layer 1. The spins injected into the first ferromagnetic layer 1 add a spin-orbit torque (SOT) to the magnetization of the first ferromagnetic layer 1 to change the orientation direction of the magnetization of the first ferromagnetic layer 1. When a flowing direction of the current is reversed, the direction of the spins injected into the first ferromagnetic layer 1 is reversed, and thus the orientation direction of the magnetization can be freely controlled.

The resistance value of the laminate 10 in the laminating direction decreases in a case in which the magnetization of the first ferromagnetic layer 1 and the magnetization of the second ferromagnetic layer 2 are parallel and increases in a case in which the magnetization of the first ferromagnetic layer 1 and the magnetization of the second ferromagnetic layer 2 are antiparallel. Data is recorded in the magnetoresistance effect element 100 as the resistance value in the laminating direction of the laminate 10.

Next, first, the reading operation of data from the arbitrary magnetoresistance effect element 100 will be described. A case in which data is read from the first magnetoresistance effect element 100A as the arbitrary magnetoresistance effect element 100 will be described as an example.

In a case of reading data, first, the first gate transistor GTr1 connected to the first magnetoresistance effect element 100A is turned on. When the first gate transistor GTr1 is turned on, the first gate G1 connected to the first gate wiring GL1 opens. Then, the first region A1 and the second region A2 of the shared transistor STr are electrically connected to each other.

Next, the second wiring control transistor Tr4 connected to the second wiring L2 connected to the first magnetoresistance effect element 100A is turned on. Further, the first wiring control transistor Tr3 connected to the first wiring L1 connected to the first shared transistor STr1 or the second shared transistor STr2 is turned on. Since the first wiring L1 and the second wiring L2 are electrically connected to each other, a reading current flows in the laminating direction of the laminate 10. On the other hand, since the second gate G2 does not open, the reading current does not flow to the second magnetoresistance effect element 100B.

When the resistance value of the laminate 10 in the laminating direction changes in accordance with Ohm's law, the output voltage changes. For that reason, for example, by reading the voltage in the laminating direction of the laminate 10, the data recorded in the first magnetoresistance effect element 100A can be read out.

The magnetic recording array 200 according to the first embodiment can increase the integration of the integration area IA. The shared transistor STr requires a smaller area than in a case in which two transistors Tr are arranged side by side since the first region A1 of the shared transistor Str that functions as two transistors Tr also serves as the source region or drain region of the two transistors. For that reason, a distance between the magnetoresistance effect elements 100 adjacent to each other in the x direction can be shortened, and the integration of the integration area IA is increased.

Although an example of the first embodiment has been illustrated so far, the present invention is not limited to this example.

Second Embodiment

Figure 5:
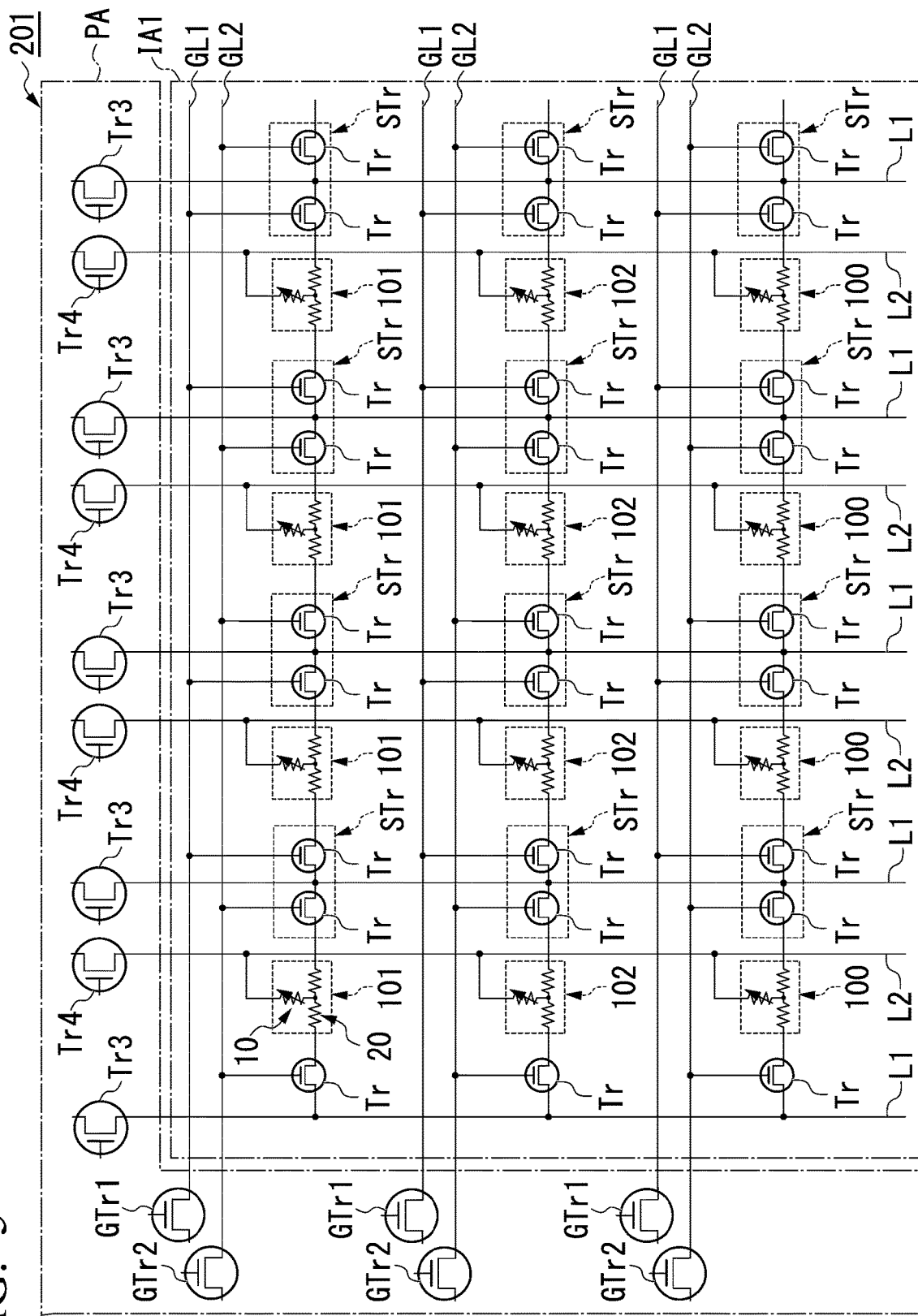
FIG. 5 is a circuit diagram of a magnetic recording array according to a second embodiment.

FIG. 5 is a circuit diagram of a magnetic recording array 201 according to a second embodiment. The magnetic recording array 201 according to the second embodiment is different from the magnetic recording array 200 according to the first embodiment in that some of the magnetoresistance effect elements 100 in an integration area IA1 are first reference elements 101 and second reference elements 102. In the second embodiment, the description of the same configuration as that of the first embodiment will be omitted.

The first reference element 101 and the second reference element 102 are present, for example, one in one column. Each of the first reference element 101 and the second reference element 102 is connected to, for example, one first wiring L1. The number of the first reference elements 101 and the second reference elements 102 is not limited to this case. There is at least one first reference element 101 and one second reference element 102 in the magnetic recording array 201.

The first reference element 101 has the same configuration as the magnetoresistance effect element 100 except that the electrical resistance of the wiring 20 is higher than the electrical resistance of the magnetoresistance effect element 100. The electrical resistance of the wiring 20 of the first reference element 101 may be, for example, equal to or more than 105%, or equal to or more than 110% of the electrical resistance of the wiring 20 of the magnetoresistance effect element 100.

A difference in electrical resistance between the first reference element 101 and the magnetoresistance effect element 100 can be freely designed by changing a width, a thickness, and a constituent material of the wiring 20. For example, the width of the wiring 20 of the first reference element 101 is narrower than the width of the wiring 20 of the magnetoresistance effect element 100. The width of the wiring 20 of the first reference element 101 is, for example, equal to or less than 95%, or equal to or less than 90% of the width of the wiring 20 of the magnetoresistance effect element 100.

The second reference element 102 has the same configuration as the magnetoresistance effect element 100 except that the electrical resistance of the wiring 20 is lower than the electrical resistance of the magnetoresistance effect element 100. The electrical resistance of the wiring 20 of the second reference element 102 is, for example, equal to or less than 95%, or, equal to or less than 90% of the electrical resistance of the wiring 20 of the magnetoresistance effect element 100.

A difference in electrical resistance between the second reference element 102 and the magnetoresistance effect element 100 can be freely designed by changing the width, the thickness, and the constituent material of the wiring 20. For example, the width of the wiring 20 of the second reference element 102 is wider than the width of the wiring 20 of the magnetoresistance effect element 100. The width of the wiring 20 of the second reference element 102 may be, for example, equal to or more than 105, or equal to or more than 110% of the width of the wiring 20 of the magnetoresistance effect element 100.

The first reference element 101 and the second reference element 102 are used when confirming whether or not writing is properly performed in the magnetoresistance effect element 100.

For example, in a case in which the writing operation is performed on the magnetoresistance effect element 100, the same writing operation is also performed on the first reference element 101 and the second reference element 102 that are paired with the magnetoresistance effect element 100. The first reference element 101 and the second reference element 102 paired with the magnetoresistance effect element 100 are, for example, the first reference element 101 and the second reference element 102 connected to the same first wiring L1 as that of the magnetoresistance effect element 100. A voltage applied to respective wirings of the first reference element 101 and the second reference element 102 is the same as that of the magnetoresistance effect element 100. The same load as that on the magnetoresistance effect element 100 is applied to the first reference element 101 and the second reference element, and the same data is written to the first reference element 101 and the second reference element.

Next, the resistance values of the magnetoresistance effect element 100, the first reference element 101, and the second reference element 102 are compared. The resistance value is, for example, the electrical resistance between the electrode E and the conductive portion 32. Each resistance value is obtained by applying a reading current. In the case of operating properly, the electrical resistance of the first reference element 101 is higher than the electrical resistance of the magnetoresistance effect element 100. Further, the electrical resistance of the second reference element 102 is lower than the electrical resistance of the magnetoresistance effect element 100.

In a case in which the electrical resistance of the magnetoresistance effect element 100 is not between the electrical resistance of the first reference element 101 and the electrical resistance of the second reference element 102, it can be determined that the magnetoresistance effect element 100 has failed.

One aspect of the failure of the magnetoresistance effect element 100 is deterioration or breakage of the wiring 20 between the laminate 10 and the conductive portions 31 and 32. If the wiring 20 deteriorates or is broken, proper writing operation cannot be performed. For example, in a case in which the wiring 20 between the laminate 10 and the conductive portion 31 deteriorates or is broken, the writing operation cannot be performed, but the reading operation can be performed. This is because the writing current flowing between the conductive portion 31 and the conductive portion 32 does not normally flow, but the reading current between the laminate 10 and the conductive portion 32 flows normally. In this case, the data is read without noticing that the data has not been written, and the risk of erroneous reading of the data increases. By comparing the electrical resistance of the magnetoresistance effect element 100 with the electrical resistances of the first reference element 101 and the second reference element 102, this failure mode can be appropriately detected.

The magnetic recording array 201 according to the second embodiment is excellent in integration like the magnetic recording array 200 according to the first embodiment.

In addition, the magnetic recording array 201 according to the second embodiment compares the electrical resistance of the first reference element 101 and the second reference element 102 with the electrical resistance of the magnetoresistance effect element 100, so that the presence or absence of the failure of the magnetoresistance effect element 100 can be evaluated in real time.

Further, since the first reference element 101 and the second reference element 102 are in the same temperature environment as the magnetoresistance effect element 100, variation of a reference point serving as a threshold for data recording due to a change in temperature can be inhibited. Further, since the first reference element 101 and the second reference element 102 are subjected to the same load as the magnetoresistance effect element 100, variation of the reference point serving as the threshold for data recording due to deterioration can be inhibited.

Third Embodiment

Figure 6:
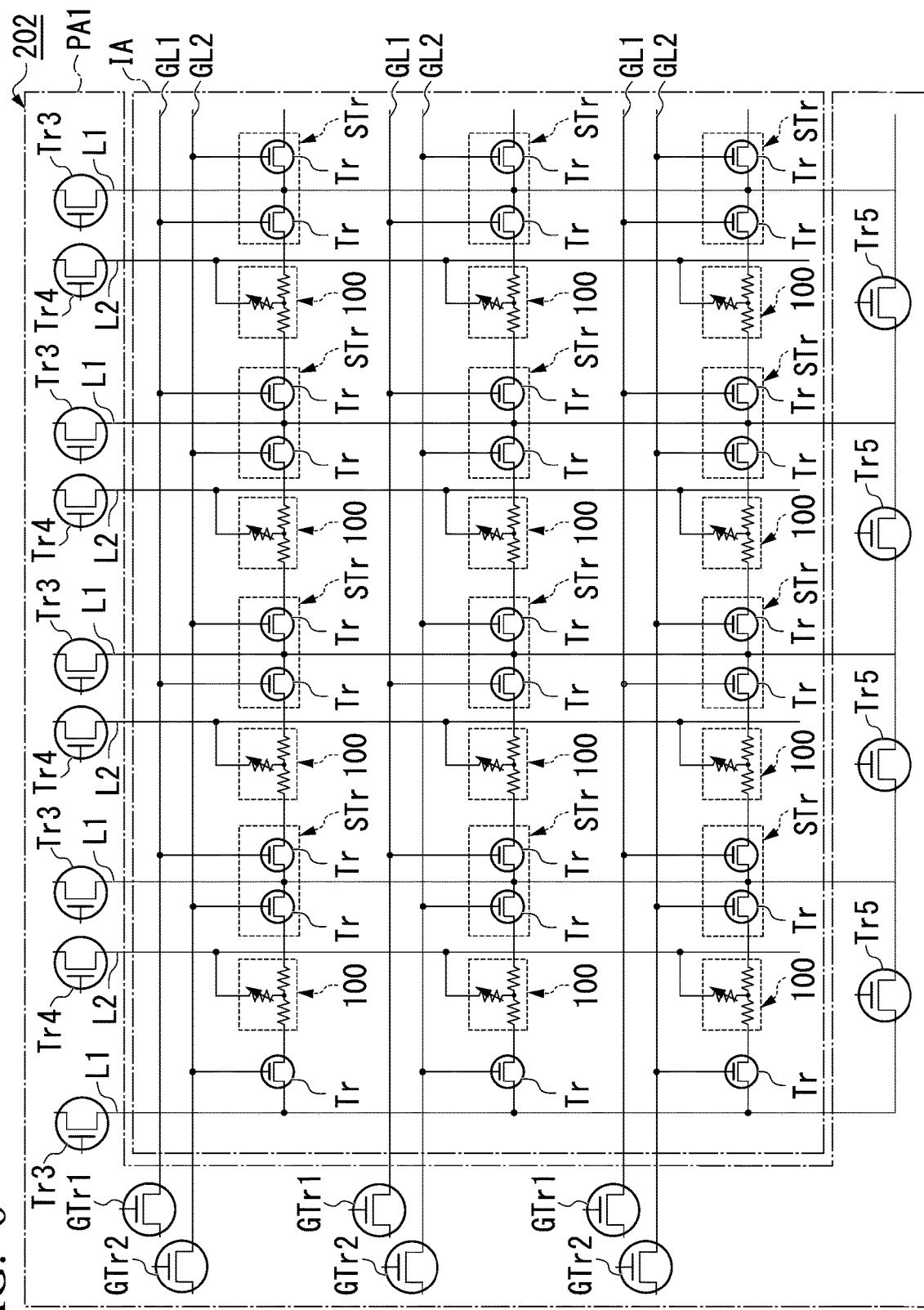
FIG. 6 is a circuit diagram of a magnetic recording array according to a third embodiment.

FIG. 6 is a circuit diagram of a magnetic recording array 202 according to a third embodiment. The magnetic recording array 202 according to the third embodiment is different from the magnetic recording array 200 according to the first embodiment in that the adjacent first wirings L1 are connected to each other via a short-circuit transistor Tr5. In the third embodiment, the description of the same configuration as that of the first embodiment will be omitted.

The short-circuit transistor Tr5 belongs to the peripheral area PA1 The short-circuit transistor Tr5 does not affect the integration of the integration area IA.

The short-circuit transistor Tr5 connects second ends of the adjacent first wirings L1 to each other. The second end is an end portion opposite to an end portion of the first wiring L1 to which the first wiring control transistor Tr3 is connected. The short-circuit transistor Tr5 is turned off when data is written and turned on when data is read out. When the short-circuit transistor Tr5 is turned on, the adjacent first wirings L1 are short-circuited.

When the adjacent first wirings L1 are short-circuited, the reading current shunts from the laminate 10 toward both ends of the wiring 20. By obtaining the resistance value of the magnetoresistance effect element 100 on the basis of the two shunted reading currents, the data can be read out with higher accuracy.

Further, the magnetic recording array 202 according to the third embodiment is excellent in integration like the magnetic recording array 200 according to the first embodiment.

Fourth Embodiment

Figure 7:
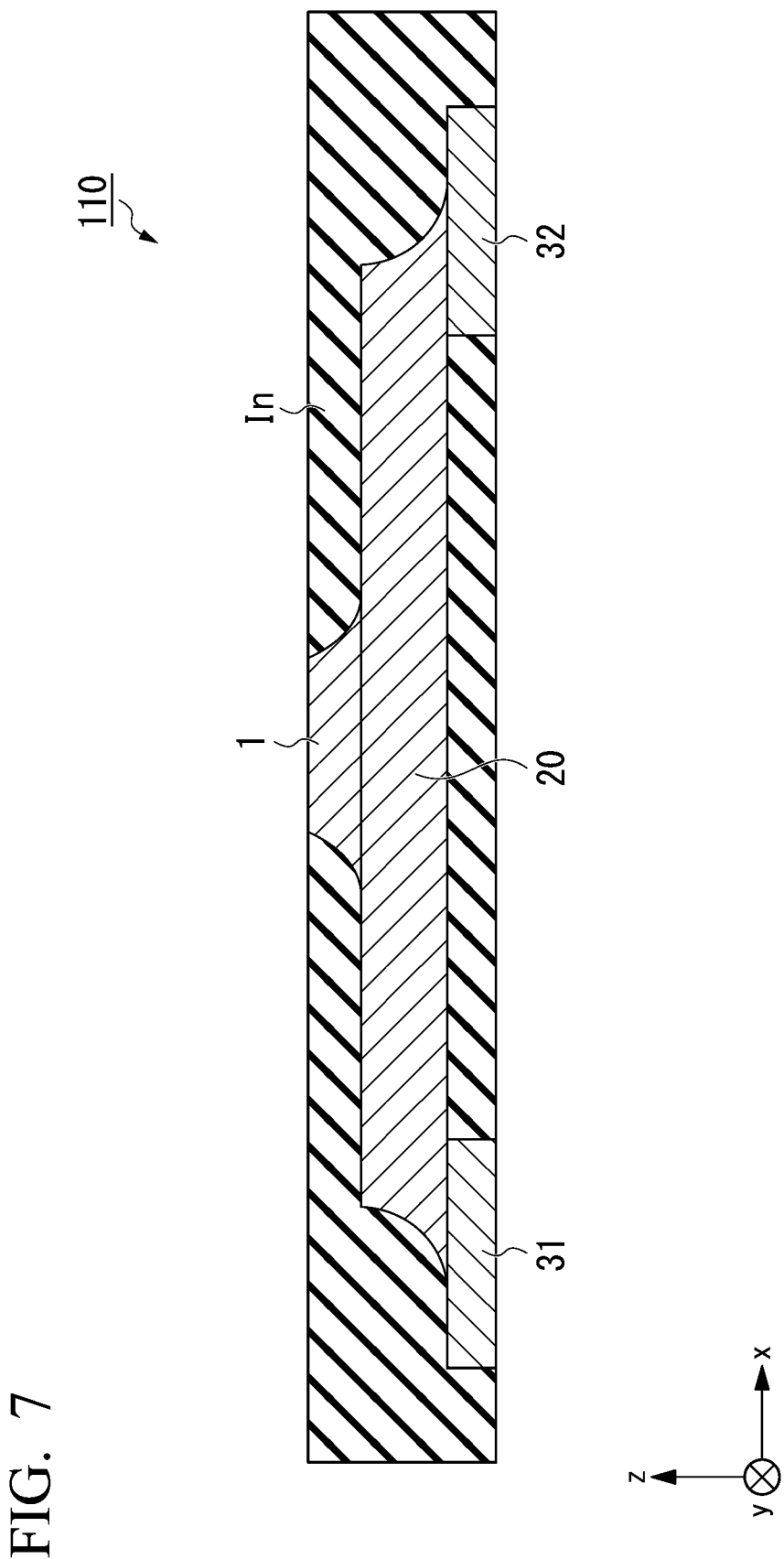
FIG. 7 is a cross-sectional view of a spin element according to a fourth embodiment.

FIG. 7 is a cross-sectional view of a magnetization rotational element 110 according to a fourth embodiment. FIG. 7 is a cross-section of the magnetization rotational element 110 cut in the x-z plane passing through the center of the width of the wiring 20 in the y direction. The magnetization rotational element 110 according to the fourth embodiment is different from the magnetoresistance effect element 100 according to the first embodiment in that it does not have the non-magnetic layer 3 and the second ferromagnetic layer 2. Other configurations are the same as those of the magnetoresistance effect element 100 according to the first embodiment, and the description thereof will be omitted.

The magnetization rotational element 110 is an example of a spin element. The magnetization rotational element 110 evaluates, for example, light incident on the first ferromagnetic layer 1 and reflected by the first ferromagnetic layer 1. When the orientation direction of magnetization changes due to the magneto-optical Kerr effect, a deflection state of the reflected light changes. The magnetization rotational element 110 can be used, for example, for an optical element of, for example, an image display device that utilizes a difference in the deflection state of light.

In addition, the magnetization rotational element 110 can be used alone for an anisotropic magnetic sensor, an optical element that utilizes the magnetic Faraday effect, and the like.

The magnetization rotational element 110 according to the fourth embodiment only removes the non-magnetic layer 3 and the second ferromagnetic layer 2 and can obtain the same effect as the magnetoresistance effect element 100 according to the first embodiment. Further, the magnetoresistance effect elements 100 according to the second embodiment and the third embodiment may be replaced with the magnetization rotational element 110.

Fifth Embodiment

Figure 8:
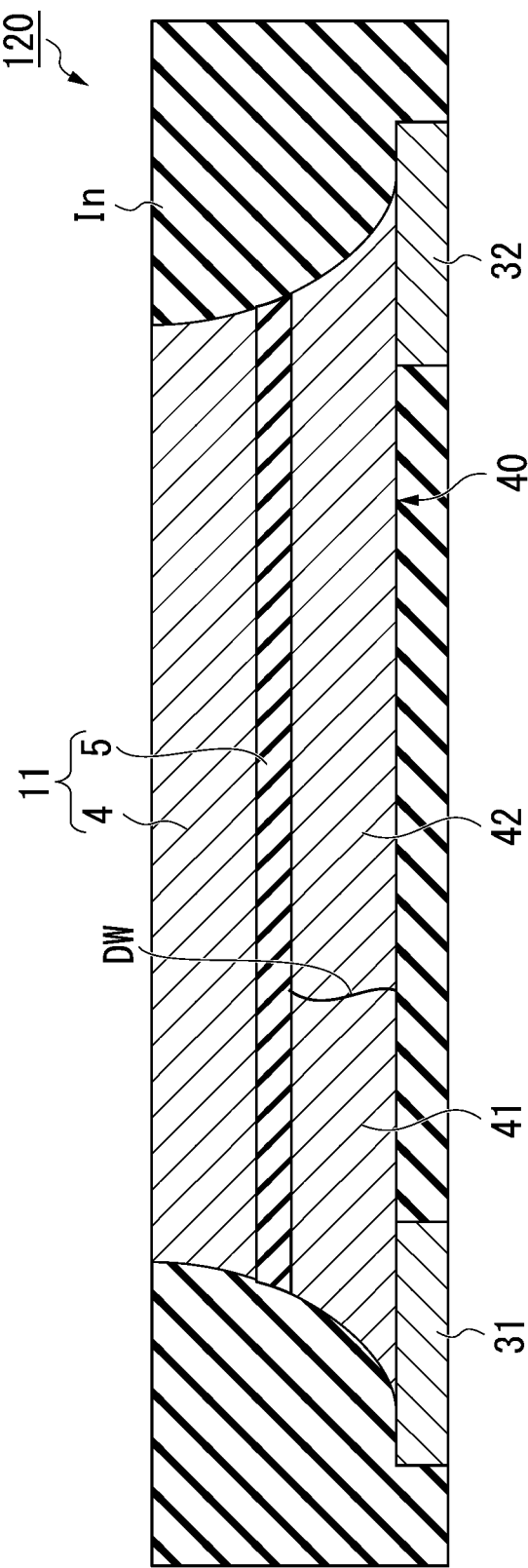
FIG. 8 is a cross-sectional view of a spin element according to a fifth embodiment.

FIG. 8 is a cross-sectional view of a magnetoresistance effect element 120 according to a fifth embodiment. FIG. 8 is a cross-section of the magnetoresistance effect element 120 cut in the x-z plane passing through a center of a width of a wiring 40 in the y direction. The magnetoresistance effect element 120 is different from the magnetoresistance effect element 100 in that a laminate 11 is configured of a non-magnetic layer 5 and a first ferromagnetic layer 4 from the side closer to the wiring 40. The same configurations as those of the magnetoresistance effect element 100 will be denoted by the same reference numerals, and the description thereof will be omitted.

The magnetoresistance effect element 120 includes the laminate 11, the wiring 40, and the conductive portions 31 and 32. The laminate 11 is configured of the non-magnetic layer 5 and the first ferromagnetic layer 4 from the side closer to the wiring 40. The magnetoresistance effect element 120 is an element whose resistance value changes due to movement of a magnetic domain wall DW and may be referred to as a magnetic domain wall movement element or a magnetic domain wall displacement type magnetoresistance effect element. The magnetoresistance effect element 120 is an example of a spin element.

The wiring 40 is a magnetic layer. The wiring 40 includes a ferromagnetic material. A metal selected from the group consisting of Cr, Mn, Co, Fe and Ni, an alloy containing at least one of these metals, an alloy containing these metals and at least one or more elements of B, C, and N, or the like can be used as the magnetic material constituting the wiring 40. Specific examples thereof include Co—Fe, Co—Fe—B, and Ni—Fe.

The wiring 40 is a layer capable of magnetically recording information by changing an internal magnetic state thereof. The wiring 40 has a first magnetic domain 41 and a second magnetic domain 42 therein. Magnetization of the first magnetic domain 41 and magnetization of the second magnetic domain 42 are oriented in opposite directions, for example. A boundary between the first magnetic domain 41 and the second magnetic domain 42 is the magnetic domain wall DW. The wiring 40 can have the magnetic domain wall DW therein.

The magnetoresistance effect element 120 can record data in multiple values or continuously depending on the position of the magnetic domain wall DW of the wiring 40. The data recorded on the wiring 40 is read out as a change in the resistance value of the magnetoresistance effect element 120 when a reading current is applied.

The magnetic domain wall DW moves by flowing a writing current in the x direction of the wiring 40 or applying an external magnetic field. For example, when a writing current (for example, a current pulse) is applied in the +x direction of the wiring 40, electrons flow in the −x direction opposite to the current, and thus the magnetic domain wall DW moves in the −x direction. When a current flows from the first magnetic domain 41 to the second magnetic domain 42, spin-polarized electrons in the second magnetic domain 42 reverse the magnetization of the first magnetic domain 41. By reversing the magnetization of the first magnetic domain 41, the magnetic domain wall DW moves in the −x direction.

Each of the first ferromagnetic layer 4 and the non-magnetic layer 5 is the same as the first ferromagnetic layer 1 and the non-magnetic layer 3 according to the first embodiment.

The magnetoresistance effect element 120 according to the fifth embodiment can also obtain the same effect as the magnetoresistance effect element 100 according to the first embodiment. Further, the magnetoresistance effect elements 100 according to the second embodiment and the third embodiment may be replaced with the magnetoresistance effect element 120.

The magnetic recording array according to the first to fifth embodiments can be applied to a neuromorphic device. A neuromorphic device is an element that imitates the human brain by means of a neural network. The neuromorphic device artificially mimics the relationship between neurons and synapses in the human brain.

The neuromorphic device has, for example, hierarchically arranged chips (neurons in the brain) and transmission means (synapses in the brain) connecting them. The neuromorphic device increases the percentage of correct answers to questions by learning by means of communication (synapses). Learning is to find knowledge that can be used in the future from information, and the neuromorphic device weights input data.

Each synapse mathematically performs multiply and accumulate calculation. In the magnetic recording array according to the first to fifth embodiments, the multiply and accumulate calculation can be performed by arranging the magnetoresistance effect elements or the magnetization rotational elements in an array. For example, when a current is passed through a readout path of the magnetoresistance effect element, the product of the input current and the resistance of the magnetoresistance effect element is output, and the multiply calculation is performed. When a plurality of magnetoresistance effect elements are connected by a common wiring, the multiply calculation is added by the common wiring and the accumulate calculation is performed. Therefore, the magnetic recording array according to the first to third embodiments can be applied to a neuromorphic device as a multiply and accumulate calculation device.

REFERENCE SIGNS LIST 1, 4 First ferromagnetic layer
2 Second ferromagnetic layer
3, 5 Non-magnetic layer
4 First ferromagnetic layer
10, 11 Laminate
20, 40 Wiring
100 Magnetoresistance effect element
100A First magnetoresistance effect element
100B First magnetoresistance effect element
101 First reference element
102 Second reference element
200, 201, 202 Magnetic recording array
A1 First region
A2 Second region
A3 Third region
DW Magnetic domain wall
G1 First gate
G2 Second gate
GL1 First gate wiring
GL2 Second gate wiring
L1 First wiring
L2 Second wiring
STr Shared transistor
STr1 First shared transistor
STr2 Second shared transistor
STr3 Third shared transistor
Tr3 First wiring control transistor
Tr4 Second wiring control transistor
Tr5 Short-circuit transistor

The invention claimed is:

1. A magnetic recording array comprising:
a plurality of spin elements; and
a shared transistor connected to a first spin element and a second spin element adjacent to each other,
wherein each of the plurality of spin elements includes a wiring and a laminate including a first ferromagnetic layer laminated on the wiring,
the shared transistor includes a first gate, a second gate, a first region, a second region, and a third region,
in a plan view in a laminating direction of the laminate,
the first region is sandwiched between the first gate and the second gate, the second region together with the first region sandwiches the first gate, and the third region together with the first region sandwiches the second gate,
one of the second region and the third region is connected to the first spin element, and the other is connected to the second spin element,
at least one of the plurality of spin elements is a first reference element having a higher electrical resistance of the wiring thereof than other spin elements, and
at least one of the plurality of spin elements is a second reference element having a lower electrical resistance of the wiring than other spin elements,
a wiring width of the wiring of the first reference element is narrower than wiring widths of other spin elements, and
a wiring width of the wiring of the second reference element is wider than wiring widths of other spin elements.

* * * * *